United States Patent [19]

Kitamura et al.

[11] Patent Number: 4,866,366
[45] Date of Patent: Sep. 12, 1989

[54] NEGATIVE FEEDBACK POWER SUPPLY APPARATUS

[75] Inventors: Fumio Kitamura; Toshitsugu Tajima, both of Chino, Japan

[73] Assignee: Kitamura Kiden., Ltd, Chino, Japan

[21] Appl. No.: 149,146

[22] Filed: Jan. 27, 1988

[30] Foreign Application Priority Data

Jan. 30, 1987 [JP] Japan ................................ 62-18625

[51] Int. Cl.[4] ............................................... G05F 1/12
[52] U.S. Cl. ................................. 323/247; 323/356
[58] Field of Search ............... 323/247, 249, 250, 254, 323/328, 355, 356, 359; 363/1, 8

[56] References Cited

U.S. PATENT DOCUMENTS 3,931,566 1/1976 Pask et al. ........................ 323/285
4,213,083 7/1980 Freygang ........................... 323/247

FOREIGN PATENT DOCUMENTS 2812303 10/1979 Fed. Rep. of Germany .
0287209 12/1986 Japan .

OTHER PUBLICATIONS

Orengo et al., "DC Flux Compensating Circuit for Reducing the Size of Transformers", IBM Technical Disclosure, Jun. 1978, pp. 223–224.
Proc. IEEE, vol. 121, No. 11, Nov. 1974, pp. 1419–1420.
Patent Abstracts of Japan, vol. 8, No. 133 (P 281) [1570], Jun. 20, 1984; & JP-A-59 34 166 (Mitsubishi Denki K.K.) 24-02-1984.

Primary Examiner—Patrick R. Salce
Assistant Examiner—Kristine Peckman
Attorney, Agent, or Firm—Merchant, Gould, Smith, Edell, Welter & Schmidt

[57] ABSTRACT

In a power supply apparatus for a load such a toroidal core testing apparatus, an input current is supplied to the load, and an output voltage of the load is obtained. A current corresponding to one part of the output voltage is negatively fed back to the input current.

4 Claims, 9 Drawing Sheets

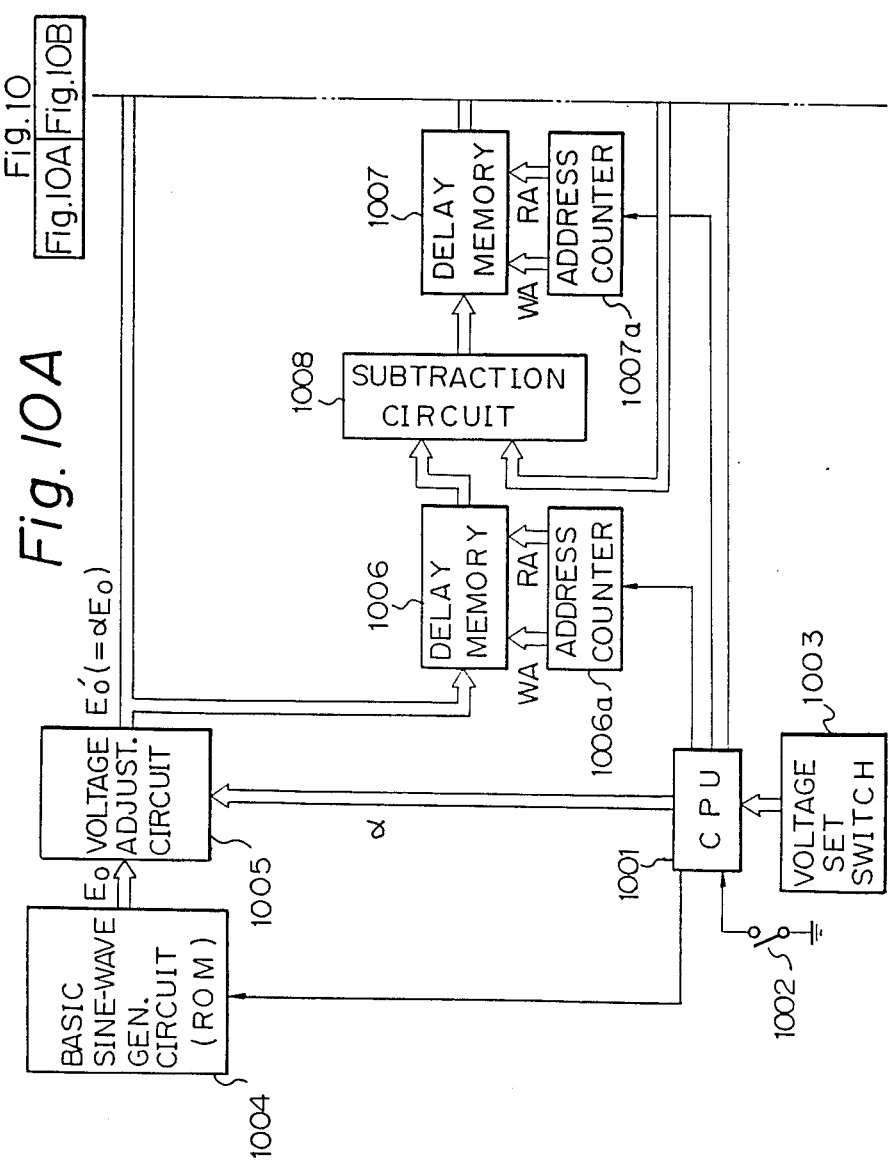

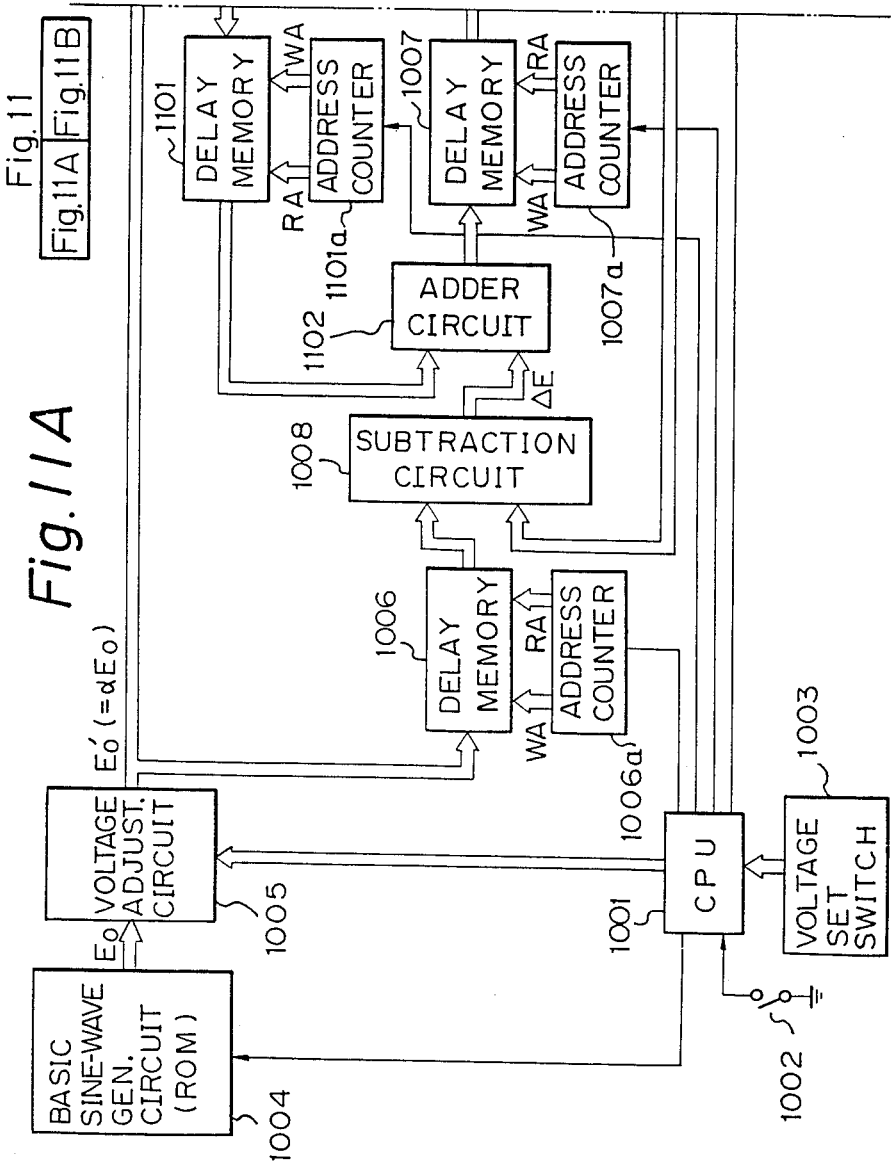

NEGATIVE FEEDBACK POWER SUPPLY APPARATUS

BACKGROUND OF THE INVENTION (1) Field of the Invention

The present invention relates to a negative feedback power supply apparatus for a load. For example, the present invention is applied to an apparatus for testing the AC magnetization characteristics of a toroidal core or a cut-core type core, a power supply apparatus for a load of a rectifier circuit, or a power supply apparatus for a load for a distorted current.

(2) Description of the Related Art

In order to carry out a testing of the AC magnetization characteristics of a large number of toroidal cores, such as exciting currents, and a core loss such as a vortex current loss and a hysteresis loss, it is necessary to wind windings on a core for every test. To simplify this winding operation, connector-type contacts may be used to reduce the desorption of the windings. However, in the actual design of transformers or the like, since the thickness of the windings is as large as possible, to reduce the resistance value thereof, and the number of turns of the windings is large, a current flowing therethrough is small and the reduction in potential and heat generation by the resistance component of the windings is also small. Contrary to this, when the connector-type contacts are used, since the space for installing the connector-shaped contacts is restricted, the thickness of the windings is small and the number of turns of the windings is small. As a result, it is necessary to increase a test exciting current supplied to the primary winding, but such a current is affected by the resistances of the windings and the contacts.

In a prior art testing apparatus for a toroidal core having primary and secondary windings, an input AC power supply and an AC current meter are connected to the primary winding, and an AC voltage meter is connected to the secondary winding. Further, a power meter is connected between the primary winding and the secondary winding. In this apparatus, a measurement of a primary current $I_P$ and a measurement of a core loss are carried out at the periphery of a saturated magnetic flux, which is one of the AC magnetization characteristics to be tested. Note that the measurement of core loss is made by the power meter.

However, fluctuation of the equivalent DC resistance of the primary winding is caused by the heat generated by the exciting current, and fluctuation of the contact DC resistance of a connector-type contact is caused by the state of the contact. Further, fluctuation of the equivalent AC resistance of the primary winding is caused by the saturation characteristics of the core. Therefore, a large fluctuation occurs in the output voltage of the secondary winding. Further, at the periphery of a saturated magnetic flux density, an extraordinary current generated locally at one cycle of the AC current invites a spontaneous reduction in the equivalent AC resistance, and as a result, the waveform of the output voltage generated at the secondary winding is greatly distorted. This large fluctuation and distortion lead to the generation of a large fluctuation and distortion in the magnetic flux density of the core, which is very disadvantageous from the viewpoint of obtaining a definite AC magnetic flux density. Accordingly, to make the output voltage of the secondary winding constant, even when the voltage of the AC power supply is adjusted so as to correct the output voltage generated in the secondary winding $W_2$, the distortion of the magnetic flux density waveform, i.e., the distortion of the output voltage, remains and, simultaneously, the peak current portion of the exciting current is suppressed. Therefore, it is impossible to carry out a correct measurement.

SUMMARY OF THE INVENTION

Therefore, an object of the present invention is to provide a power supply apparatus for testing a core, whereby a winding operation using connector-type contacts is unnecessary, an adjustment of an input voltage for every core is unnecessary even when the DC resistance and the equivalent AC and DC resistances of the primary winding are changed by the contacts, and no distortion is generated in the magnetic flux density of the core, thereby enabling a correct and stable measurement.

Another object of the present invention is to provide a power supply apparatus for a load such as a load of a rectifier circuit and a distortion current load.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

First, a suggested power supply apparatus for a toroidal core, i.e., a suggested apparatus for testing a toroidal core, will be explained.

Figure 1:
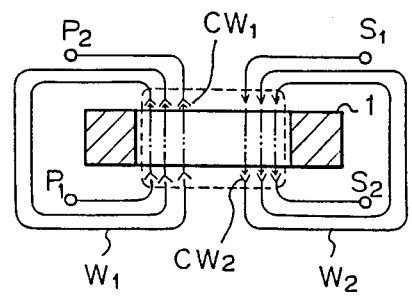
FIG. 1 is a diagram showing suggested examples of tests of windings.

As illustrated in FIG. 1, to test a toroidal core 1, test windings $W_1$ and $W_2$ may be wound on the core 1. In this case, in order to simplify the winding operation, connector-type contacts $CW_1$ and $CW_2$ are provided to reduce the desorption of the windings $W_1$ and $W_2$. In an actual design of transformers and the like, since the thickness of the windings is as large as possible, to reduce the resistance value thereof, and the number of turns of windings is as large as possible, a current flowing therethrough is small and the reduction in potential and heat generation by the resistance component of the windings is also small. In FIG. 1, however, since the space for installing the connector-type contacts $CW_1$ and $CW_2$ is restricted, the thickness of the windings is small and the number of turns of the windings is small. As a result, it is necessary to increase an exciting current or testing supplied to the primary winding $W_1$, and in addition, such a current is affected by the resistances of the windings $W_1$ and $W_2$ and the contacts $CW_1$ and $CW_2$. In FIG. 1, note that upper and lower contacts of the connector-type connectors $CW_1$ and $CW_2$ are separated from each other when the core 1 is inserted thereinto, and are connected when a testing (measuring) operation is carried out, and thus a winding operation of the windings $W_1$ and $W_2$ is unnecessary.

Figure 2:
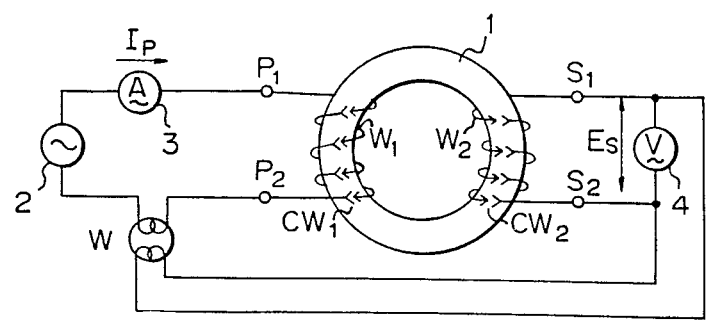
FIG. 2 is a circuit diagram illustrating a suggested apparatus for testing a toroidal core.

In FIG. 2, a testing apparatus for the toroidal core 1 having the test windings $W_1$ and $W_2$ is illustrated. In FIG. 2, reference numeral 2 designates an input AC power supply, 3 an AC current meter, 4 an AC voltage meter, $P_1$ and $P_2$ terminals for the connection of the primary winding $W_1$, and $S_1$ and $S_2$ terminals for the connection of the secondary winding $W_2$. According to this circuit, a measurement of a primary current $I_P$ and a measurement of core loss are carried out at the periphery of a saturated magnetic flux of the core 1, which is one of the tests of AC magnetization characteristics. Note that the measurement of core loss is made by a power meter W.

Figure 3A:
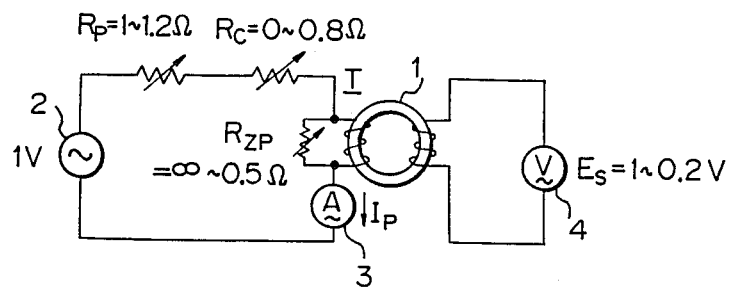
FIGS. 3A and 3B are equivalent circuit diagrams of the apparatus of FIG. 2.
Figure 3B:
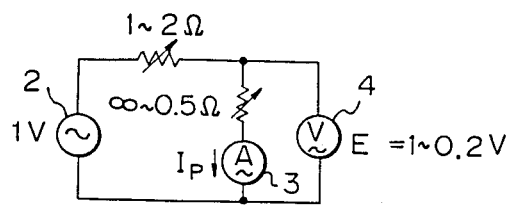
Figure 4:
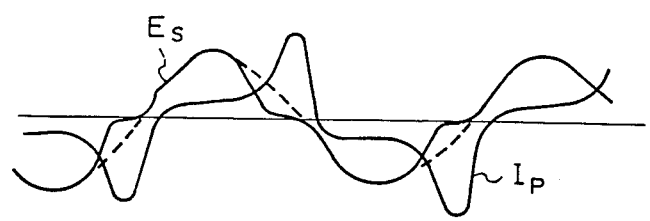
FIG. 4 is a diagram showing the output characteristics of the apparatus of FIG. 2.

In order to easily understand the circuit of FIG. 2, an equivalent circuit thereof is illustrated in FIG. 3A, and a simplified equivalent circuit is illustrated in FIG. 3B. Note that the power meter W is omitted from FIGS. 3A and 3B. In FIG. 3A, reference T designates an ideal transformer, $R_P$ an equivalent DC resistance of the primary winding $W_1$, $R_C$ an equivalent contact DC resistance of the connector contact $CW_1$, and $R_{ZP}$ an equivalent AC resistance of the primary winding $W_1$. Note that the resistances of the secondary winding $W_2$ and the contact $CW_2$ are negligible. For example, the equivalent DC resistance $R_P$ and the equivalent DC resistance $R_C$ are unstable. That is, the resistance $R_P$ fluctuates from 1 to 1.2 $\Omega$ due to the generation of heat by the exciting current $I_P$, and the contact DC resistance $R_C$ fluctuates from 0 to 0.8 $\Omega$ due to the state of the contact $CW_1$. Also, the equivalent AC resistance $R_{ZP}$ fluctuates from $\infty$ to 0.5 $\Omega$ due to the saturation characteristics of the core 1. Therefore, if the voltage of the AC power supply 2 is 1 V, and an exciting current $I_P$ is supplied to the primary winding $W_1$, the output voltage $E_S$ of the secondary winding $W_2$ is 1 V where $R_P = 1 \Omega$, $R_C = 0 \Omega$ and $R_{ZP} = \infty \Omega$, and 0.2 V where $R_P = 1.2 \Omega$, $R_C = 0.8 \Omega$, and $R_{ZP} = 0.5 \Omega$, which means that the fluctuation of the output voltage $E_S$ is large. Further, at the periphery of a saturated magnetic flux density of the core 1, an extraordinary current generated locally at one cycle of the AC current invites a spontaneous reduction in the equivalent AC resistance $R_{ZP}$, and as a result, the waveform of the output voltage $E_S$ generated at the secondary winding $W_2$ is greatly distorted. This large fluctuation and distortion leads to the generation of a large fluctuation and distortion in the magnetic flux of the core 1, which is very disadvantageous in view of the need to obtain a definite AC magnetic flux. Accordingly, to make the output voltage $E_S$ constant, when the voltage of the AC power supply 1 is adjusted so as to correct the voltage $E_S$ generated in the secondary winding $W_2$, the distortion of the magnetic flux waveform, i.e., the distortion of the output voltage $E_S$, remains as illustrated in FIG. 4, and simultaneously, the peak current portion of the exciting current $I_P$ is suppressed. Therefore, it is impossible to carry out a correct measurement.

Figure 5:
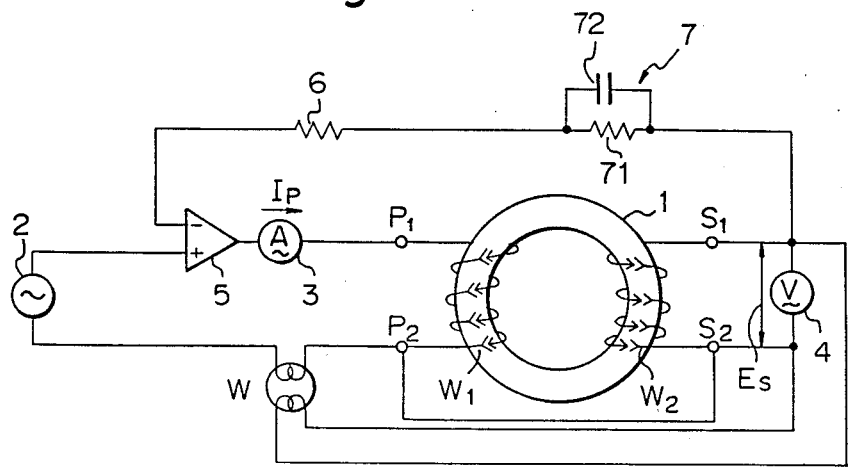
FIG. 5 is a circuit diagram illustrating a first embodiment of the power supply apparatus according to the present invention.
Figure 6:
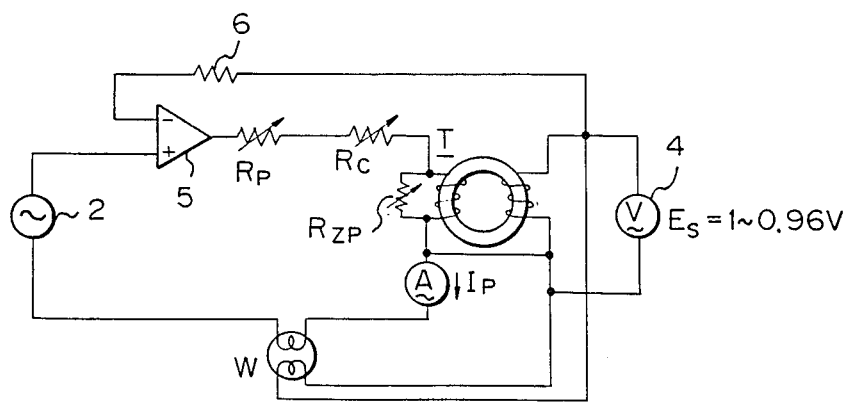
FIG. 6 is an equivalent circuit diagram of the apparatus of FIG. 5.

In FIG. 5, which illustrates a first embodiment of the present invention applied to a testing apparatus for a toroidal core, an analog negative feedback loop circuit is added to the elements of FIG. 2. That is, an amplifier 5, a feedback resistor 6, and a phase adjusting circuit 7 formed by a capacitor 71 and a resistor 72 are added to the elements of FIG. 2. Note that FIG. 6 is an equivalent circuit diagram of the apparatus of FIG. 5.

Here, assume that there is no negative feedback circuit, the amplification factor F of the amplifier 5 having an output impedance O is 100, and the voltage of the AC power supply 2 is 1 V × 1/100 = 0.01 V. Then, the circuit of FIG. 5 is substantially the same as that of FIG. 2, and therefore, if the values of the equivalent DC resistance $R_P$, the equivalent contact resistance $R_C$, and the equivalent AC resistance $R_{ZP}$ are the same as in FIG. 3A, the output voltage $E_S$ is also changed from 1 to 0.2 V. That is, if a total amplification factor A' is determined by the ratio of the input voltage (=0.01 V) of the AC power supply 2 to the output voltage $E_S$, the factor A' is fluctuated by $$A' = 100 \sim 20.$$

Next, consider the presence of the negative feedback circuit according to the present invention. Here, the feedback ratio F is made 0.99 by the feedback resistor 6, the output voltage $E_S$ can be represented by $$E_S = \frac{A'}{1 + A' \cdot F} \times E_1$$

where $E_1$ is the output voltage of the AC power supply 2 and is, in this case, 1 V. Therefore, the maximum o voltage $E_S$ $$= \frac{100}{1 + 0.99 \times 100} \times 1 \text{ V}$$
$$= 1.00 \text{ V},$$

and the minimum of the output voltage $E_S$ $$= \frac{20}{1 + 0.99 \times 20} \times 1 \text{ V}$$
$$= 0.96 \text{ V}.$$

Thus, the fluctuation of the output voltage $E_S$ is reduced compared with the case of FIG. 3A (FIG. 3B). Therefore, even when the DC resistance by the contacts, and the equivalent AC and DC resistances of the primary winding $W_1$ are fluctuated, a substantial adjustment of the input voltage is unnecessary, and as a result, the distortion of the magnetic flux waveform in the core 1, i.e., the distortion of the output voltage $E_S$, is reduced. Note that, if the amplification factor of the amplifier 5 is increased to increase the feedback factor F, the stability of the output voltage $E_S$ can be improved. However, when the feedback factor F is increased, an oscillation phenomenon may occur due to the leak reactances of the windings. Such an oscillation phenomenon can be suppressed by adjusting the resistor 71 and/or the capacitor 72 of the phase adjusting circuit 7, to a certain extent.

In the circuit of FIG. 5 having an analog negative feedback circuit, an accurate measurement can be obtained for a directional silicon steel core having a magnetic flux density of about 17,000 gauss. Also, when an extremely distorted exciting current $I_P$ is supplied to the primary winding $W_1$ thereby generating a saturated magnetic flux density of about 18,000 to 20,000 gauss in the core 1, both the feedback factor F and the amplification factor A' must be increased to obtain a highly accurate and stable measurement. In this case, however, an oscillation phenomenon always occurs. That is, when the amplification factor A' is larger than 1 and a phase shift amount in the negative feedback loop circuit is larger than 180°, the oscillation conditions may be satisfied. Such a phase shift amount is commonly generated by the capacitance component in the negative feedback loop circuit in a relatively high frequency region, and in addition, it is difficult to completely adjust such a phase shift amount by the phase adjusting circuit 7. It is also difficult to adjust this phase shift amount when an inductance component due to the windings and the leak inductances therebetween is added to the negative feedback loop circuit.

Figure 7:
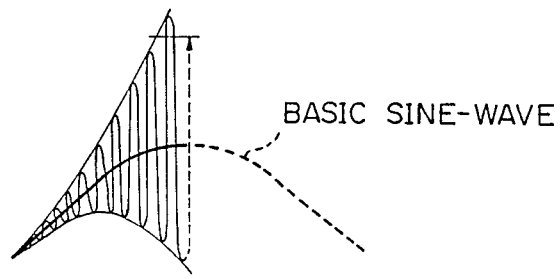
FIG. 7 is a diagram showing an oscillation phenomenon generated in the apparatus of FIG. 5.

Thus, in the core 1 having a relatively high magnetic flux density, even if an analog negative feedback loop circuit is used, the output voltage $E_S$ of the secondary winding $W_2$ is still distorted and unstable. That is, in the circuit of FIG. 5, after the oscillation conditions are satisfied in the analog negative feedback loop circuit, a positive feedback control at a specific frequency of about 10 KHz to 1 MHz is triggered by differential noise or the like, and as a result, the amplitude of the input voltage applied to the core 1 is rapidly increased as illustrated in FIG. 7.

Figure 8:
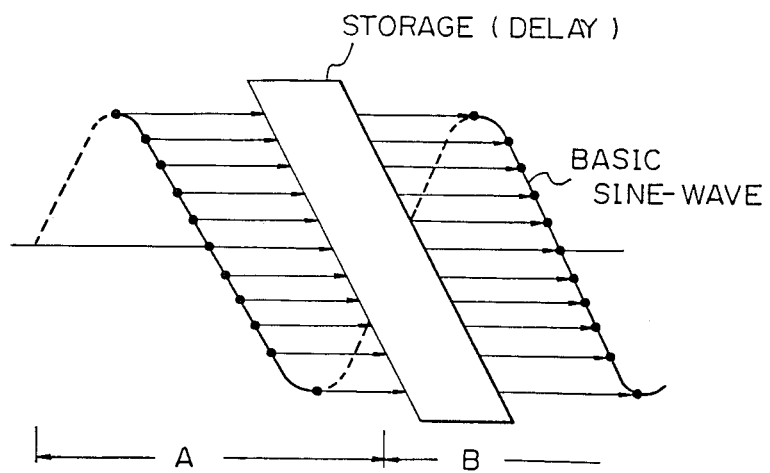
FIGS. 8 and 9 are timing diagrams schematically explaining a basic principle of the present invention.
Figure 9:
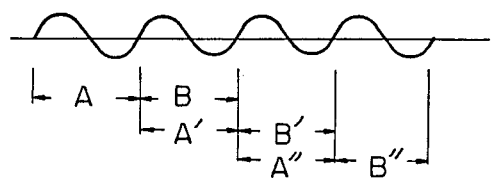

In FIGS. 8 and 9, which show a digital negative feedback control according to the present invention, to prevent the generation of a positive feedback phenomenon in the negative feedback loop circuit, a waveform to be negatively fed back is stored and is delayed by one cycle of a basic sine-wave, and thereafter, a negative feedback control is carried out by using the delayed waveform. That is, as illustrated in FIG. 8, a voltage error between an input sine-wave voltage and an output voltage is stored and delayed for a period A, and the input sine-wave voltage is corrected by the delayed voltage error for a period B. Therefore, as illustrated in FIG. 9, even when a phase shift amount in the negative feedback loop circuit is larger than 180°, a positive feedback phenomenon is split for every cycle of the basic sine-wave form, so that oscillation is not generated.

Figure 10B:
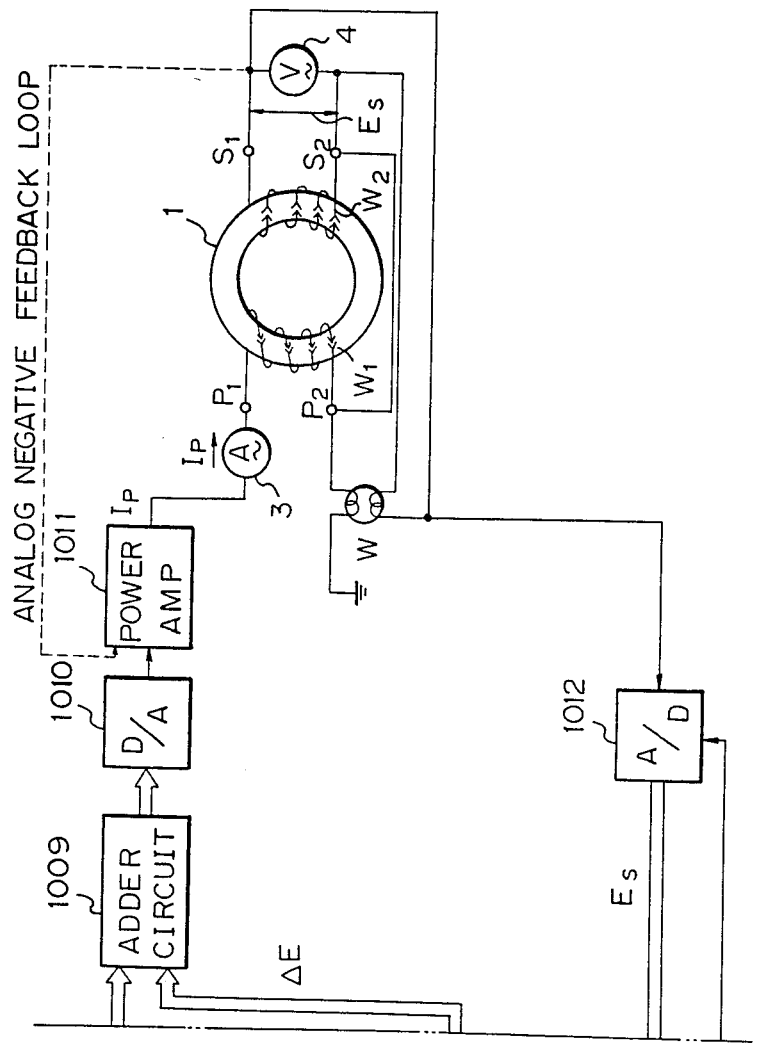
FIGS. 10 and 11 are circuit diagrams illustrating second and third embodiments, respectively, of the power supply apparatus according to the present invention.

In FIG. 10, which illustrates a second embodiment of the present invention realizing the principle of FIGS. 8 and 9, which is also applied to an apparatus for testing a toroidal core. In FIG. 10, a digital negative feedback loop circuit is provided. That is, reference numeral 1001 designates a control portion (CPU); 1002 a frequency switch; 1003 a voltage set switch formed by digital switches; 1004 a basic sine-wave generating circuit (ROM) for generating a sine-wave voltage $E_0$; and 1005 a voltage adjusting circuit (multiplier) for adjusting the output of the basic sine-wave generating circuit 1004. In this case, the frequency of the basic sine-wave voltage $E_0$ of the basic sine-wave generating circuit 1004 is changed by the control portion 1001 in accordance with the state of the frequency switch 1002. That is, the control portion 1001 generates a clock signal having a frequency in accordance with the state of the frequency switch 1002 and transmits this clock to the basic sine-wave generating circuit 1004. Also, the control portion 1001 generates a voltage factor a in accordance with the output of the voltage set switch 1003. As a result, the voltage adjusting circuit 1005 multiplies each digital value of the basic sine-wave voltage $E_0$ by the voltage factor $\alpha$ to generate a new basic sine-wave voltage $E_0'$.

Reference numerals 1006 and 1007 designate delay memories for adjusting a total delay time corresponding to one cycle of the basic sine-wave voltage $E_0$ ($E_0'$). Each of the delay memories 1006 and 1007 may be constructed by a bidirectional memory in which a write operation and a read operation can be simultaneously carried out. That is, the delay memories 1006 and 1007 are associated with address counters 1006a and 1007a, respectively, and therefore, the delay memories 1006 and 1007 are operated by write addresses WA and read addresses RA of the address counters 1006 and 1007, which are counted up by clock signals of the control portion 1001. In this case, the delay time period of the delay memory 1006 (1007) is determined by $$(RA - WA) \times T$$

where
  RA is a read address;
  WA is a write address; and
  T is a frequency period of the clock signal supplied from the control portion 1001.

A subtraction circuit 1008 calculates a digital voltage error $\Delta E$ between the basic sine-wave voltage $E_0'$ and an analog/digital (A/D) converted output voltage $E_S$ from the ends of the secondary winding $W_2$ via an A/D converter 1012. Also, an adder circuit 1009 adds the delayed voltage error $\Delta E$ to the basic sine-wave voltage $E_0'$. A D/A converter 1010 performs a D/A conversion upon the output of the adder circuit 1010, and as a result, a power amplifier 1011 supplies an input current $I_P$ to the primary winding $W_1$ in accordance with the analog voltage of the D/A converter 1010.

Figure 12:
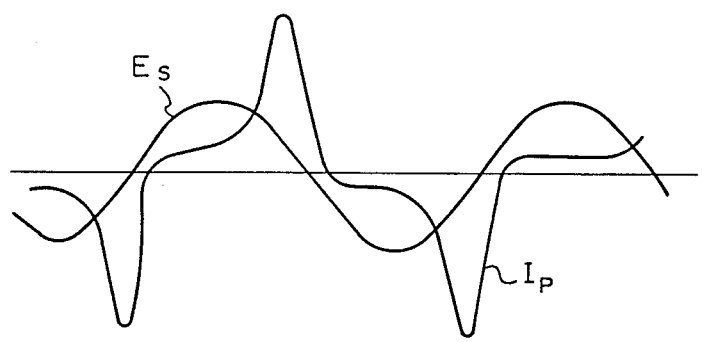
FIG. 12 is a diagram showing the output characteristics of the apparatuses of FIGS. 10 and 11.

Thus, the output voltage $E_S$ of the secondary winding $W_2$ is negatively fed back by the digital negative feedback loop circuit formed by the elements 1006, 1008, 1007, and 1012. In addition, a waveform to be fed back is delayed for one cycle of the basic sine-wave voltage $E_0$. As a result, the output voltage $E_S$ is stable, as illustrated in FIG. 12, even when the magnetic flux density of the core 1 is extremely large.

Figure 11B:
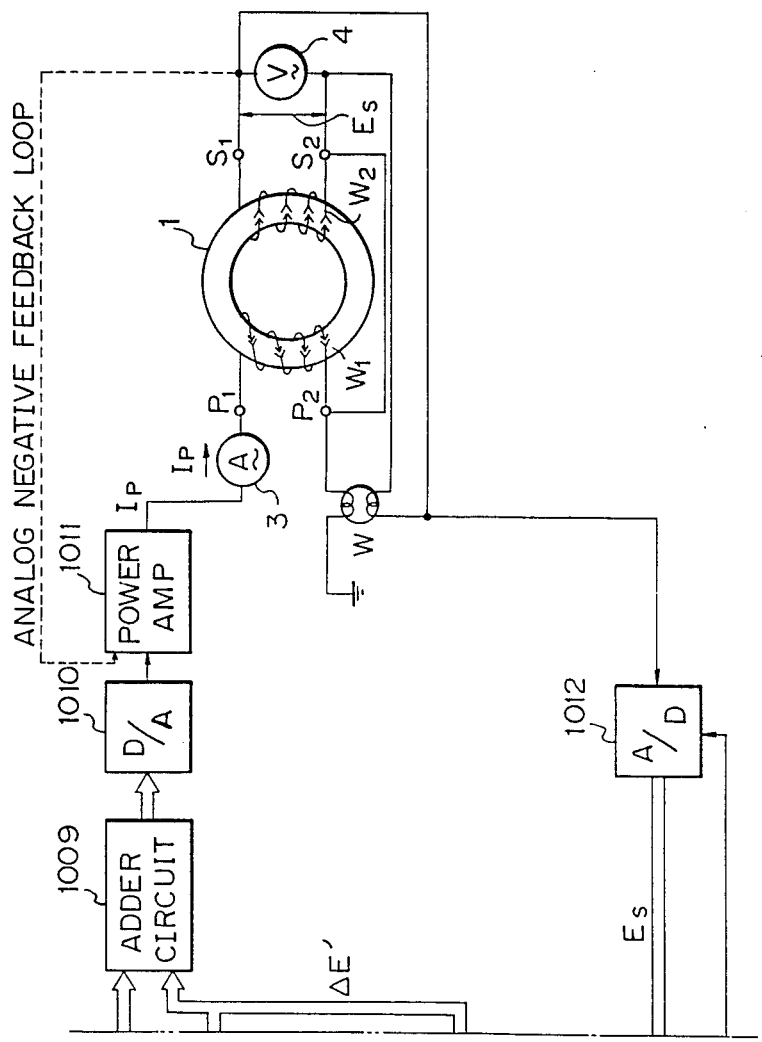

In FIG. 11, which illustrates a third embodiment of the present invention, a delay memory 1101, an address counter 1101a, and an adder circuit 1102 are added to the elements of FIG. 10. In this case, the three delay memories 1006, 1007, and 1101 adjust a total delay time period corresponding to one cycle of the basic sine-wave voltage $E_0$ ($E_0'$). Therefore, in FIG. 11, the voltage error $\Delta E'$ to be fed back is summed and added to the basic sine-wave voltage $E_0'$, thereby remarkably increasing the feedback factor F. For example, if the feedback factor F for the first cycle is 0.9, the feedback factor F for the second cycle is 0.99. Also, the feedback factor F for the third cycle, the fourth cycle, . . . is 0.999, 0.9999, . . .

Note that the second and third embodiments of FIGS. 10 and 11 can be combined with the first embodiment of FIG. 5. That is, an analog negative feedback loop circuit formed by the elements 6 and 7 of FIG. 5 is added to the circuit of FIGS. 10 or 11, as indicated by dotted lines. In this case, the power amplifier 1011 also serves as the differential amplifier 5 of FIG. 5. As a result, it is possible to completely correct the output voltage $E_S$ at an even higher speed.

Also, in the above-mentioned embodiments, the primary winding $W_1$ and the secondary winding $W_2$ can be of a type other than the connector-type. Also, it is possible to carry out a highly accurate and stable testing (measurement) even when the number of turns of the windings is 1. Also, the arrangement and installation of the contacts $CW_1$ and $CW_2$ can be freely determined. Further, the number of turns of the primary winding $W_1$ need not be the same as that of the secondary winding $W_2$.

Further, the present invention can be applied to an apparatus for testing a separate-type core, and the present invention can be still applied to other power supply apparatuses such as a power supply apparatus for a load of a rectifier circuit, or a power supply apparatus for a distorted current load.

As explained above, according to the present invention, for example, in a core testing apparatus, a winding operation for each core is unnecessary, and a correct and stable test (measurement) can be carried out without adjusting the input voltage, even when the magnetic flux density of a core is extremely large.

We claim:

1. A power supply apparatus for a load, comprising:
   means for a basic sine-wave voltage;
   means, connected to said basic sine-wave voltage generating means and an output of said load, for detecting a voltage error therebetween;
   means, connected to said voltage error detecting means, for delaying said voltage error by one cycle of said basic sine-wave voltage;
   means, connected to said basic sine-wave voltage generating means and said delaying means, for adding said delay voltage error to said basic sine-wave voltage; and
   means, connected between said adding means and said load, for supplying an input current to said load in accordance with the result of addition by said adding means.

2. An apparatus as set forth in claim 1, further comprising a negative feedback loop connected between the output of said load and said input current supplying means.

3. An apparatus as set forth in claim 1, wherein said load comprises a core having a primary winding and a secondary winding wound thereon,
   said input current supplying means supplying said input current to said primary winding,
   said output voltage being a voltage between ends of said secondary winding.

4. A power supply apparatus for a load, comprising:
   means for generating a basic sine wave voltage;
   means, connected to said basic sine wave voltage generating means and output of said load, for detecting a voltage error therebetween;
   means, connected to said voltage detecting means, for delaying said voltage error by one cycle of said basic sine wave voltage;
   means, connected to said voltage error detecting means and said delaying means, for adding said delayed voltage error to said voltage; and
   means connected between said adding means and said load, for supplying an input current to said load in accordance with the result of addition by said adding means.

* * * * *

UNITED STATES PATENT AND TRADEMARK OFFICE
CERTIFICATE OF CORRECTION

PATENT NO.  : 4,866,366

DATED       : September 12, 1989

INVENTOR(S) : Fumio Kitamura et al.

It is certified that error appears in the above-identified patent and that said Letters Patent is hereby corrected as shown below:

Front Page, Assignee:
    after "Kiden" insert --Co.--

Abstract, line 1:
    "a" (3rd) should be --as--

Col. 4, line 36:
    delete "o" and insert therefor --of the output--

Col. 6, line 1:
    "a" (2nd) should be --$\alpha$--

Signed and Sealed this

Seventeenth Day of December, 1991

*Attest:*

HARRY F. MANBECK, JR.

*Attesting Officer*     *Commissioner of Patents and Trademarks*